United States Patent [19]

Schucht

[11] 4,123,726
[45] Oct. 31, 1978

[54] CIRCUIT FOR SYNCHRONIZING THE OSCILLATION OF AN OSCILLATOR KEYED BY A PULSE, WITH A REFERENCE OSCILLATION

[75] Inventor: Peter Schucht, Munich, Germany

[73] Assignee: Siemens Aktiengesellschaft, Berlin & Munich, Germany

[21] Appl. No.: 833,488

[22] Filed: Sep. 15, 1977

[30] Foreign Application Priority Data

Oct. 27, 1976 [DE] Fed. Rep. of Germany ....... 2648796

[51] Int. Cl.² .............................................. H03B 3/04
[52] U.S. Cl. ....................................... 331/14; 331/17; 331/173; 331/117 D; 331/36 C
[58] Field of Search ........................... 331/14, 17, 173; 307/232; 328/155

[56] References Cited

U.S. PATENT DOCUMENTS

| | | | |
|---|---|---|---|
| 3,546,618 | 12/1970 | Menkes | 331/14 |
| 3,573,649 | 4/1971 | West | 331/14 |
| 3,609,577 | 9/1971 | Bos | 331/14 |
| 3,921,095 | 11/1975 | Chu | 331/14 |
| 3,991,378 | 11/1976 | Schaefer | 331/14 |

*Primary Examiner*—John Kominski

*Attorney, Agent, or Firm*—Hill, Gross, Simpson, Van Santen, Steadman, Chiara & Simpson

[57] ABSTRACT

A circuit for synchronizing an oscillator keyed by a pulse is provided with a low amplitude reference oscillation. A phase shift regulating loop has a phase discriminator which is fed, on one hand, with a branched component of the oscillator output and, on the other hand, with the reference oscillation. The phase discriminator compares the phases of the two oscillators and emits a resultant regulating voltage an adjustable reactance for controlling the oscillator frequency during the leading edge of the keying pulse. A phase shift device, adjustable over 180°, is connected between the oscillator and the phase discriminator, the phase discriminator having a high-ohmic output which is connected, via an impedance converter, to the adjustable reactance. A sampling switch is interposed between the impedance converter and the adjustable reactance, the switch being closed at the beginning of a pulse and opened shortly before the end of a pulse, the pulses being of predetermined duration, and a holding circuit holds the regulating voltage at least to an approximate value across the adjustable reactance prior to the end of a pulse, until the closing of the sampling switch.

12 Claims, 4 Drawing Figures

CIRCUIT FOR SYNCHRONIZING THE OSCILLATION OF AN OSCILLATOR KEYED BY A PULSE, WITH A REFERENCE OSCILLATION

BACKGROUND OF THE INVENTION

1. Field of the Invention

The invention relates to a circuit for synchronizing the oscillation of an oscillator keyed by a pulse, with a reference oscillation which has a relatively low amplitude and which is input-coupled into the oscillator, employing a phase regulating loop with a phase discriminator which is supplied, on the one hand, with a branched portion of the oscillator output oscillation and, on the other hand, is simultaneously supplied with the reference oscillation, and which compares the phase states of these two oscillations and emits a resultant regulating voltage for the control of an adjustable reactance for the frequency modification of the oscillator keyed by a pulse actually during the leading edge of the pulse, and more specifically where a phase shift device which can be adjusted up to 180° is connected between the oscillator and the phase discriminator, and the high-ohmic output of the phase discriminator is connected in low-ohmic fashion via an impedance converter to the adjustable reactance.

2. Description of the Prior Art

A synchronizing circuit of this general type is described in the German allowed and published application No. 25, 32, 004.

In the circuit described in this German application, with every pulse of a pulse train, it is necessary for the phase regulating loop to build-up again and to again compensate the entire frequency error of the oscillation of the oscillator relative to the reference oscillation.

SUMMARY OF THE INVENTION

The object of the invention is to improve upon the circuit described in the German application No. 25, 32, 004 in respect of its build-up behavior in the case of subsequent pulses, so that it is possible to effect a frequency stabilization of the oscillator keyed by a pulse within a shorter length of time.

According to the invention, this object is realized in that between the impedance converter and the adjustable reactance there is interposed a sampling switch, which is always closed at the beginning of a pulse, or shortly thereafter, and is always opened shortly before the end of the pulses, which are predetermined in duration, with a holding circuit which at least approximately holds the regulating voltage value which prevailed across the adjustable reactance prior to the end of the pulse, until the next closure of the sampling switch.

The holding circuit can, for example, consist of the adjustable reactance, e.g. a varactor diode, or a known circuit comprising a charging capacitor and a field effect transistor.

BRIEF DESCRIPTION OF THE DRAWINGS

Other objects, features and advantages of the invention, its organization, construction and operation will be best understood from the following description, taken in conjunction with the accompanying drawings, on which.

DESCRIPTION OF THE PREFERRED EMBODIMENTS

Figure 1:
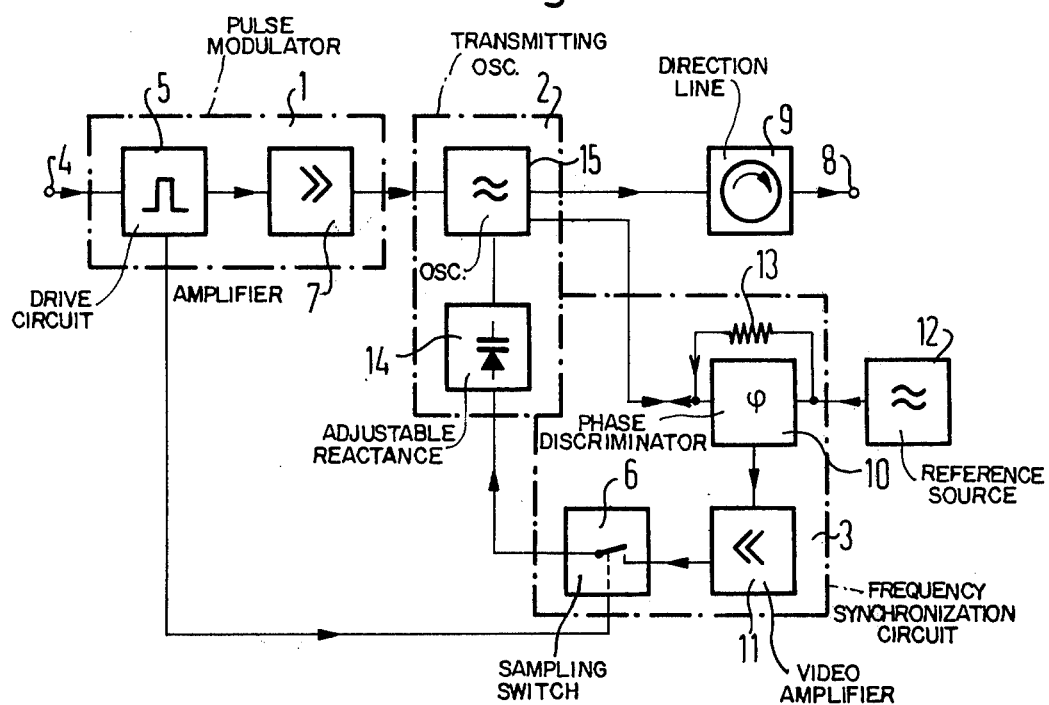
FIG. 1 is an overall block circuit diagram of a transmitter, keyed by a pulse, with a device for frequency synchronization.

FIG. 1 is a block circuit diagram of a frequency-synchronized transmitting device, which is keyed by a pulse, for use in an interrogation device or a transponder for secondary radar. The circuit comprises a pulse modulator 1, a transmitting oscillator 2 keyed by the latter, and a frequency synchronization circuit 3. The modulator 1 receives its pulse signals from an input 4 to a drive circuit 5, which must fulfill two functions. On the one hand, the drive circuit 5 controls the closing and opening times of a sampling switch 6 in the synchronization circuit 3, and, on the other hand, it effects a pulse width limitation for the modulator 1, in order to provide an overload protection for the transmitting oscillator 2, which is equipped with one, or more than one, transistor.

The modulator 1 is constructed as a multistage pulse amplifier. Its output stage is connected to the emitter of the transmitting oscillator, which latter is operated in a grounded base configuration, and switches the transmitting oscillator 2 on and off. Expediently, the output stage in the amplifier 7 of the modulator 1 is designed as a constant current source. The latter ensures that a constant current flows through the transistor of the transmitting oscillator 2, independently of the latter's collector voltage, feedback, and the power output-coupled at the output 8 via a direction line 9. This prevents a thermal overloading of the high-frequency power transistor in the transmitting oscillator 2. The rapid build-up of the transmitting oscillator is a further advantage.

The frequency synchronization circuit 3 comprises a phase discriminator 10, a video amplifier 11 with an impedance converter, and the sampling switch 6. The function of the synchronization carried out without the sampling switch 6 is already disclosed in detail in the prior art, and therefore will only be discussed briefly here. The inputs of the phase discriminator 10 are connected on the one hand, to the transmitting oscillator 2 and, on the other hand, to a reference source 12. Via a resistor 13, which shunts the phase discriminator 10, a part of the power of the reference oscillation is input-coupled into the oscillator 2. Fundamentally, an oscillator commences oscillation on a noise basis. It can be pulled into step by feeding in an oscillation of the desired frequency, if the amplitude of the pull-in oscillation is sufficiently great in comparison to the oscillator oscillation. As a result of the application of this principle, the transmitting oscillator 2 commences oscillation more rapidly, and in particular immediately, with the correct frequency. A low regulating voltage is formed in the phase discriminator 10 and increases with a rising pulse edge. Via the video amplifier 11, this regulating voltage is fed to an adjustable reactance 14 of the transmitting oscillator 2, and regulates the latter in respect of frequency in such manner that the synchronization is maintained with a large amplitude of the oscillator 2 relative to the reference oscillation. This is, however, assuming that the transition from pull-in to follow-up is effected via the adjustable reactance 14 continuously and without phase jumps. With a relatively small pull-in range, this is achieved by interposing a phase shift device between the actual oscillator 15 and the phase discriminator 10.

In the circuit constructed in accordance with the German application No. 25, 32, 004, with every pulse of the pulse train, it is necessary for the regulating loop to build-up afresh, and to always recompensate the entire frequency error of the oscillation of the transmitting oscillator 2 relative to the reference oscillation of the reference source 12. By interposing the sampling switch 6 between the video amplifier 11 and the adjustable reactance 14, an improved build-up behavior is achieved, as it can be assumed that no fundamental change occurs in the frequency-determining characteristics of the oscillator 2 between pulses which follow one another at short intervals. The sampling switch 6 is advantageously realized by a high-speed field effect transistor, which is closed or opened by the drive circuit 5 at the correct times.

If the circuit illustrated in FIG. 1 is driven at the input 4 by modulation pulses, the transmitting oscillator 2 starts to oscillate, and at the same time the sampling switch 6 is closed. The circuit reaches a state of synchronization, and with the first modulation pulse at the output of the phase discriminator 10 there occurs a resulting voltage which corresponds to the frequency displacement and which is fed to the adjustable reactance 14, which, advantageously consists of a varactor diode. Shortly prior to the end of the pulse—however still during the existance of the pulse roof—the sampling switch 6 is opened again. The charge carriers present in the varactor diode 14 can only discharge slowly and therefore once the capacitance of the varactor diode 14 has been set, it is maintained for a length of time adequate for the relevant use. In respect of all the following pulses of a pulse train, the circuit only requires compensation of the small residual error in the frequency which arises as a result of the discharge time constant of the reactance (varactor diode) 14.

Figure 2:
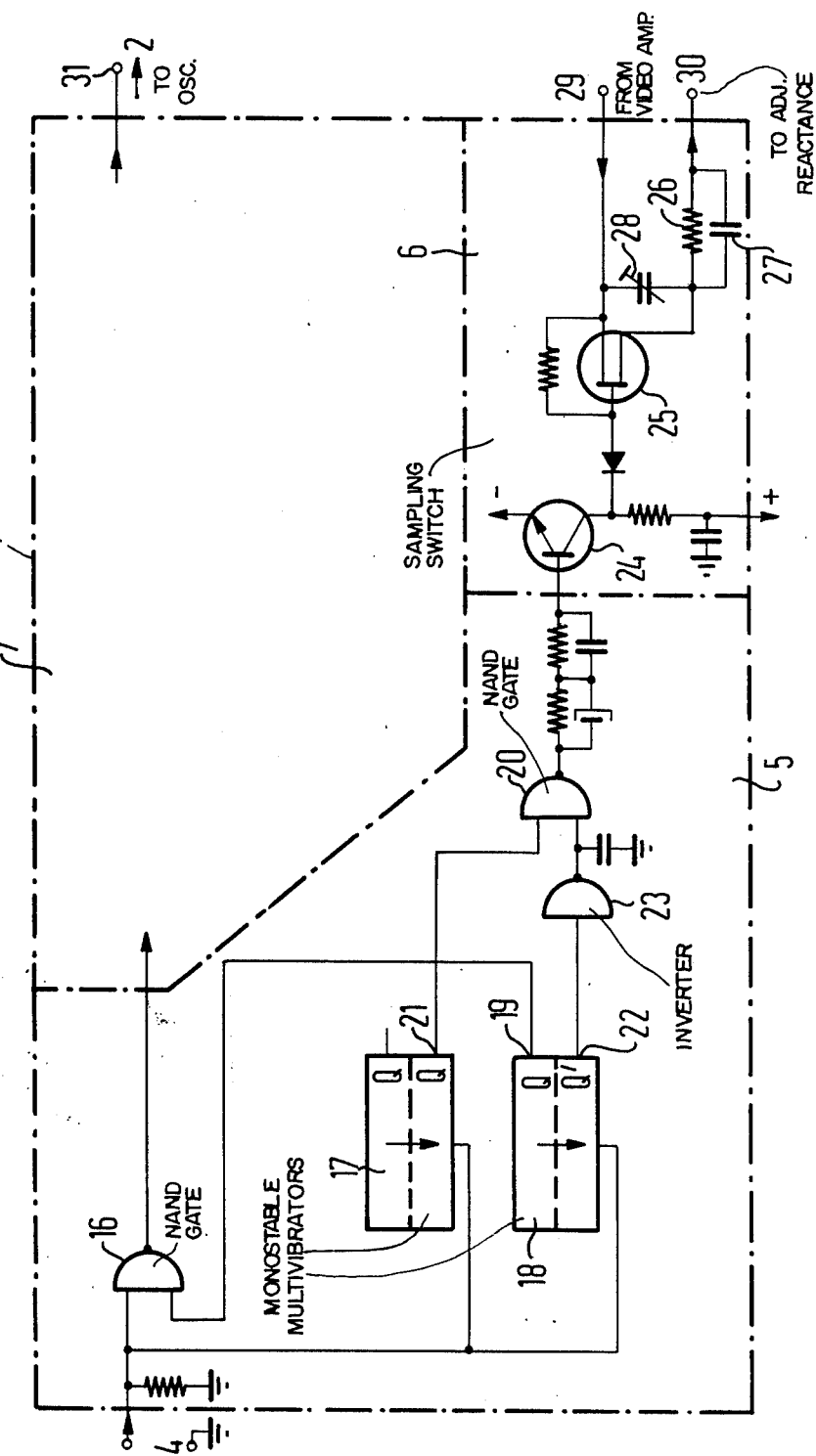
FIG. 2 is a schematic illustration of a circuit of a sampling switch together with its drive device.

FIG. 2 illustrated in detail the circuit of a sampling switch 6 and its drive circuit 5. The modulation pulses present at the input 4 pass to an input of a NAND gate 16 and to the resetting inputs of two retriggerable, monostable multivibrators 17 and 18. In the two monostable multivibrators 17 and 18, an internal connection exists from the resetting input to the setting input, so that the monostable multivibrators 17 and 18 are set by a positive pulse and are reset again with the trailing edge thereof. The multivibrator 18 is set to a resetting time of approximately 1.5 μsec, and has the function of limiting pulses having a width of more than 1.5 μsec. The output 19 of the multivibrator 18 blocks the gate 16 via its second input. The trailing edge of the output of the monostable multivibrator 17 determines the correctly timed switch-on (closure) of the sampling switch, and the falling edge of the multivibrator 18 in accordance with its opening time. The logic link to the sampling switch is effected via a NAND gate 20, whose inputs are connected to the outputs 21 and 22 of the two monostable multivibrators 17 and 18. Here the output 22 is also followed by an inverter circuit 23. Via a driver transistor 24, the output of the gate 20 controls the sampling switch which consists of a high-speed field effect transistor 25. A parallel arrangement, consisting of a resistor 26 and a capacitor 27, in series to the switch-through drain-source path of the field effect transistor 25, and a trimmer capacitor 28 in parallel with this path are responsible for the stability of the regulating loop. The connection to the video amplifier is effected via the terminal 29, and that to the adjustable reactance via the terminal 30. The modulator amplifier 7 is itself driven by the output of the NAND gate 16. The output of the modulator amplifier 7 to the transmitting oscillator 2 is referenced 31.

Figure 3:
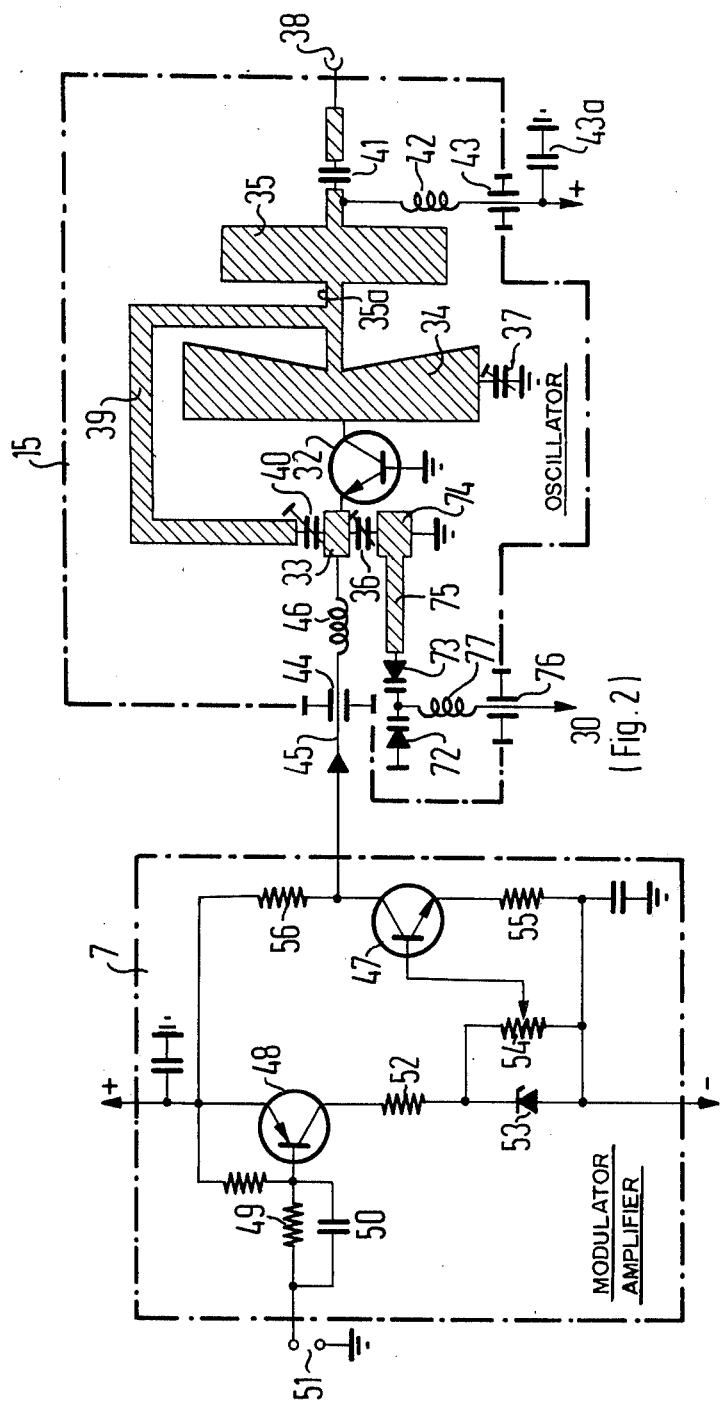
FIG. 3 is a circuit diagram of the oscillator in the transmitter with its pulse modulator.

FIG. 3 illustrates the circuit of a secondary radar transmitter for frequencies from 1–1.1 GHz with the self-sustained oscillator 15 and the modulator amplifier 7, without the latter's drive circuit. The oscillator 15, which is designed in the strip line technique, possesses a HF-power transistor 32, which is operated in a grounded base configuration, with a capacitive emitter-end surface line portion 33, and with two collector-end conductor surfaces 34 and 35 with a connection line 35a in between which represent an output matching network operating over a wide band. An emitter-end capacitance 36 and a collector-end capacitance 37 are designed as trimmer capacitors. By means of the capacitance 37 the matching can be optimized. The wide-band matching network transforms the desired, complex load resistance of the transistor 32 to the standardized line resistance at the output 38. The frequency-determining resonance circuit of the oscillator 15 is formed by the internal inductance of the emitter supply line of the transistor 32 and by the capacitance of the trimmer capacitor 36 which is connected to ground via a line portion 74 and permits tuning within the frequency range from 1–1.1 GHz. At this point, the capacitance of two varactor diodes 72 and 73, which represent the adjustable reactance, is also transformed via a line 74 into the oscillating circuit. The two varactor diodes 72 and 73, which are connected in opposition to one another, increase the modulability of the reactance. The regulating voltage emanating from the outputs 30 of the sampling switch 6 in FIG. 2 is fed via a feedthrough capacitor 76 and a high-frequency choke 77 to the connection point of the two varactor diodes 72 and 73. The feedback of the oscillator 15 between the collector and the emitter of the transistor 32 is effected internally in the transistor 32, and in addition via a line 39 having a length of approximately one-half wavelength, and via a capacitance 40 in series therewith. The signal for the antenna or possibly for an amplifier stage, is withdrawn via a capacitor 41 at the output 38. The capacitor 41 blocks the operating voltage from the output 38. The operating d.c. voltage for the transistor 32 is supplied via a high-frequency choke 42 and a feedthrough capacitor 43. A capacitor 43a, designed as switch-resistant electrolytic capacitor, supplies the requisite pulse flow for the transmitter.

The oscillator 15 is keyed via the emitter of the transistor 32 by the modulator amplifier 7, by means of a keying line 45 which extends through a feedthrough capacitor 44. A high-frequency choke 46 is additionally connected into this keying line 45. In order to protect the transistor 32 of the oscillator 15 from a thermal overload, and to maintain its operative point stable, the output stage of the modulator amplifier 7, which stage is connected to a transistor 47, is designed as a keyed constant current source. The pulsed modulator input voltage is fed to a modulator first-stage transistor 48 via a parallel arrangement of a base series resistor 49 and a capacitor 50. The input for the modulator input voltage is referenced 51, and connected to the output of the NAND gate 16 in FIG. 2. The collector of the first-stage transistor 48 is connected via a resistor 52 to a Zener diode 53 across which the constant Zener voltage drops on the switch-through of the transistor 48 when a pulse is present at the input 51. The Zener diode 53, which thus represents a pulse-controlled constant voltage source is connected in parallel with an adjustable voltage divider 54, having a tap which is connected to the base of the modulator output stage transistor 47. When the modulator 1 is keyed at the input 51, the transistor 47, which is connected by its emitter to a resistor 55 and by its collector to a resistor 56 is therefore also rendered conductive. A constant current flow in the collector of the transistor 47, which is fundamentally independent of the collector voltage and of the feedback across the transistor 32, and is also independent of the power output-coupled at the output 38, is ensured by means of the emitter resistor 55 of the transistor 47 when the latter is operated in constant fashion across its base. The requisite constant current in the keying line 45 can be set up by means of the voltage divider 54.

Figure 4:
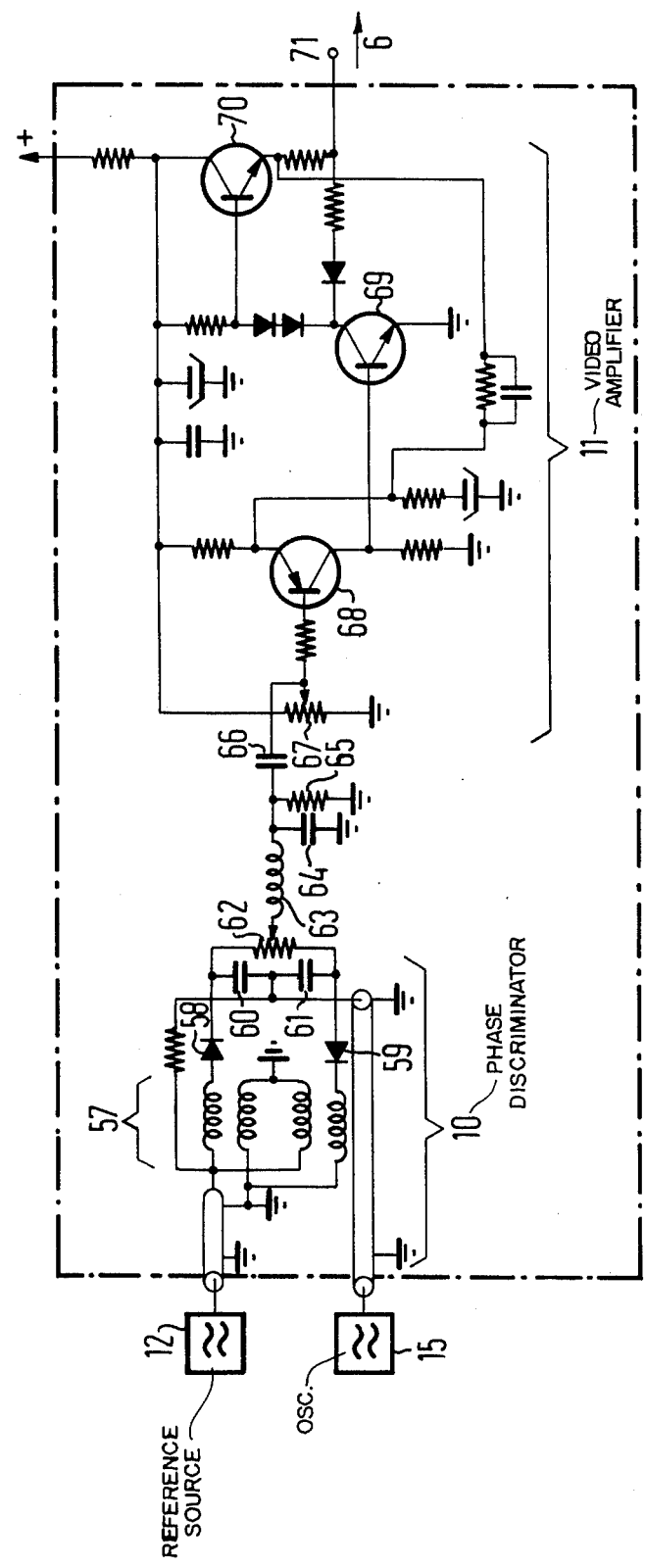
FIG. 4 is a schematic illustration of a circuit of a phase discriminator and of a subsequently connected impedance converter in the form of a video amplifier.

FIG. 4 illustrates the circuit of the phase discriminator 10 and of the video amplifier 11 in detail. The phase discriminator 10 is driven coaxially, on the one hand, by the reference oscillation source 12 and, on the other hand, by the transmitter 15. Via a symmetry transformer 57, the reference oscillation drives two diodes 58 and 59 in push-pull. The oscillator oscillation of the oscillator 15 is fed via two capacitors 60 and 61 to the diodes 58 and 59 in push-push operation. The regulating voltage is withdrawn from the central point of a potentiometer 62 and can thus also be symmetrized relative to ground. Via a low-pass filter which consists of an inductance 63, a capacitance 64 and a resistance 65, and which serves to suppress the high-frequency oscillation and via a coupling capacitor 66, the regulating voltage pulses pass to the input of the video-amplifier 11. A potentiometer 67 serves to set the operative point of the amplifier 11 to half the supply voltage.

The video amplifier 11 consists of two stages, namely a high-ohmic input stage comprising a transistor 68, and a low-ohmic, quasi-complementary output stage comprising two transistors 69 and 70. By means of a negative feedback network from the output of the output stage to the emitter of the transistor 68 of the first stage, a constant amplification in the transmission range is achieved. The video amplifier 11 is a pure voltage amplifier. The low-ohmic output stage comprising the transistors 69 and 70 must be in a position to recharge very rapidly the capacitance of the varactor diodes, i.e. of the adjustable reactance. The output of the video amplifier 11 to the sampling switch 6 is referenced 71.

Although I have described my invention by reference to particular illustrative embodiments thereof, many changes and modifications may become apparent to those skilled in the art without departing from the spirit and scope of the invention. I therefore intend to include within the patent warranted hereon all such changes and modifications as may reasonably and properly be included within the scope of my contribution to the art.

I claim:

1. A synchronization circuit for an oscillator keyed by a keying pulse, with a low amplitude reference oscillation which is input coupled to the oscillator, comprising:

a phase regulating loop including a phase discriminator connected to receive the output oscillations of the oscillator and the reference oscillation and to compare the phase states thereof and produce a resultant regulating voltage, said phase discriminator including a high impedance output;

an adjustable reactance connected to the oscillator and to said phase discriminator for controlling the output frequency of the oscillator in accordance with said regulating voltage;

a phase shift device which is adjustable up to 180° connected between the oscillator and said phase discriminator;

an impedance converter connecting said high impedance output of said phase discriminator in a low impedance fashion to said adjustable reactance;

a sampling switch serially interposed between said adjustable reactance, said sampling switch connected to receive and respond to the keying pulse and close for a duration less than the pulse duration; and a holding circuit for holding the regulating voltage across said adjustable reactance from a time prior to the end of a keying pulse until the next closure of said sampling switch.

2. The circuit of claim 1, wherein said sampling switch comprises:

a field effect transistor as a high-speed switch-through element.

3. The circuit of claim 2, and further comprising:

a capacitor connected in parallel with the switch-through path of said field effect transistor.

4. The circuit of claim 3, wherein said capacitor is a trimmer capacitor.

5. The circuit of claim 2, and further comprising:

a capacitor and a resistor connected in parallel with each other and in series with the switch-through path of said field effect transistor.

6. The circuit of claim 1, comprising:

a modulator connected to said sampling switch and including an input for receiving the keying pulses, a first monostable multivibrator connected to said input and to said sampling switch, said first multivibrator triggered by the leading edge of a keying pulse to close said sampling switch, said first multivibrator having a short fall time, and a second monostable multivibrator connected between said input and said sampling switch, said second multivibrator reset by the leading edge of a keying pulse and triggered by the trailing edge of a keying pulse to open said sampling switch.

7. The circuit of claim 6, wherein said sampling switch comprises a field effect transistor including a gate and a switch-through path, and said circuit further comprises:

gating means connected between said first and second multivibrators and said gate.

8. The circuit of claim 7, wherein said gating means comprises an AND gate.

9. The circuit of claim 7, wherein said gating means comprises a NAND gate.

10. The circuit of claim 1, wherein said impedance converter comprises a video amplifier.

11. The circuit of claim 1, wherein said holding circuit is formed by said adjustable reactance.

12. The circuit of claim 1, wherein said holding circuit comprises a field effect transistor and a charging capacitor connected to said field effect transistor.

* * * * *